(12) United States Patent
Murugesu et al.

(10) Patent No.: US 12,425,971 B1
(45) Date of Patent: Sep. 23, 2025

(54) DISTORTION REDUCING PRECODING

(71) Applicant: Nokia Solutions and Networks Oy, Espoo (FI)

(72) Inventors: Rosanah Murugesu, Murray Hill, NJ (US); Hungkei Chow, Murray Hill, NJ (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 19/077,638

(22) Filed: Mar. 12, 2025

(30) Foreign Application Priority Data

Mar. 15, 2024 (FI) ...................................... 20245309

(51) Int. Cl.
| | |
|---|---|
| *H04K 1/02* | (2006.01) |
| *H04B 7/0456* | (2017.01) |
| *H04W 52/02* | (2009.01) |
| *H04B 1/04* | (2006.01) |

(52) U.S. Cl.
CPC ...... *H04W 52/0235* (2013.01); *H04B 7/0456* (2013.01); *H04B 2001/0425* (2013.01)

(58) Field of Classification Search
CPC ............. H04W 52/0235; H04B 7/0456; H04B 2001/0425
USPC ........................................................ 375/296
See application file for complete search history.

(56) References Cited

U.S. PATENT DOCUMENTS

| | | | | |
|---|---|---|---|---|
| 11,936,343 | B2 * | 3/2024 | Hamid | H03F 3/245 |
| 12,107,608 | B2 * | 10/2024 | Zhang | H04L 25/03343 |
| 12,199,650 | B2 * | 1/2025 | Luo | H03F 3/24 |
| 2017/0310000 | A1 | 10/2017 | Gustavsson et al. | |
| 2018/0167092 | A1 | 6/2018 | Hausmair et al. | |
| 2021/0367564 | A1 | 11/2021 | Hausmair et al. | |

OTHER PUBLICATIONS

Yao et al., "A digital predistortion scheme exploiting degrees-of-freedom for massive MIMO systems", IEEE International Conference on Communications (ICC), May 20-24, 2018, 5 pages.
Office Action received for corresponding Finnish Patent Application No. 20245309, dated Oct. 14, 2024, 8 pages.
Office Action received for corresponding Finnish Patent Application No. 20245309, dated Mar. 5, 2025, 5 pages.
Extended European Search Report received for corresponding European Patent Application No. 25162893.9, dated Jul. 22, 2025, 5 pages.

(Continued)

*Primary Examiner* — Helene E Tayong
(74) *Attorney, Agent, or Firm* — Nokia Technologies Oy

(57) ABSTRACT

An apparatus may be configured to receive a signal to be transmitted via an array of antennas by a zero-forcing precoder, wherein the signal is processed by the linear precoder based on one or more input power criteria for power amplifiers of the array of antennas; apply a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices; and provide an output of the distortion reducing matrix to be used in digital pre-distortion processing of an input signal for the power amplifiers.

15 Claims, 3 Drawing Sheets

(56) References Cited

OTHER PUBLICATIONS

Brihuega et al., "Digital Predistortion for Multiuser Hybrid MIMO at mmWaves", arXiv, Mar. 16, 2020, pp. 1-15.
Lin et al., "Transmit Antenna Selection with Linear Precoding in MIMO Multiuser Systems", IEEE Global Telecommunications Conference Globecom, Dec. 6-10, 2010, 5 pages.
Wu et al., "Frequency-domain digital predistortion for Massive MU-MIMO-OFDM Downlink", IEEE Global Communications Conference (Globecom), Dec. 4-8, 2022, pp. 579-584.

* cited by examiner

DISTORTION REDUCING PRECODING

RELATED APPLICATION

This application claims benefit of priority from Finnish Patent App. No. 20245309, filed Mar. 15, 2024, the disclosure of which is hereby incorporated in its entirety by reference herein.

TECHNICAL FIELD

Various example embodiments generally relate to the field of wireless communication. Some example embodiments relate to distortion reducing precoding in multiple-input multiple-output systems.

BACKGROUND

In wireless and wireline communication systems, transmitter designs may include a power amplifier (PA) at a final stage of signal processing before an antenna to generate a high level output signal. To improve efficiency, the PA may be configured to operate near a saturation region of the PA. However, at the saturation region, the PA may exhibit nonlinear characteristics. The PA characteristics also tend to drift over time due to temperature changes, voltage variations, channel changes, aging of components, and the like. It would be beneficial to improve management of distortions caused by the PAs.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

Example embodiments of the present disclosure enable to reduce distortion of power amplifiers to be compensated by digital predistortion modules of the power amplifiers. This and other benefits may be achieved by the features of the independent claims. Further example embodiments are provided in the dependent claims, the description, and the drawings.

According to a first aspect, an apparatus is disclosed. The apparatus may comprise: at least one processor; and at least one memory storing instructions that, when executed by the at least one processor, cause the apparatus at least to receive a signal to be transmitted via an array of antennas from a linear precoder, wherein the signal is processed by the linear precoder based on one or more input power criteria for power amplifiers of the array of antennas; apply a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices; and provide an output of the distortion reducing matrix to be used in digital pre-distortion processing of an input signal for the power amplifiers.

According to an example embodiment of the first aspect, the apparatus further comprises the linear precoder configured to receive the signal to be processed and output the processed signal to the distortion reducing matrix; and wherein the one or more criteria comprise equal or fixed input power for the power amplifiers.

According to an example embodiment of the first aspect, the signal is processed by applying an equal power zero-forcing precoding matrix for equal power input to the distortion reducing matrix.

According to an example embodiment of the first aspect, the linear precoder comprises a zero-forcing precoder configured to receive the signal to be processed and output the processed signal to the distortion reducing matrix.

According to an example embodiment of the first aspect, the apparatus is further caused to process the output of the distortion reducing matrix based on digital pre-distortion models trained to compensate nonlinear distortion of the power amplifiers; and provide an output of the digital pre-distortion models as the input signal to the power amplifiers.

According to an example embodiment of the first aspect, the apparatus further comprises the power amplifiers of the array of antennas.

According to an example embodiment of the first aspect, the apparatus comprises the array of antennas and wherein the number of the antennas in the array is greater than a number of receivers served by the antennas.

According to an example embodiment of the first aspect, the distortion reducing matrix is one of a frequency independent matrix, a frequency independent vector, a frequency dependent matrix per a subcarrier or a group of subcarriers or a frequency dependent vector per a subcarrier or a group of subcarriers.

According to an example embodiment of the first aspect, the apparatus may be further caused to train the distortion reducing matrix at a startup of the apparatus for all power amplifiers of the array of antennas using random signals and random channel matrices.

According to an example embodiment of the first aspect, the distortion reducing matrix is further trained based on minimizing an error signal corresponding to a difference between a measured total input power to the power amplifiers and a total input power provided to the power amplifiers at startup of the apparatus.

According to an example embodiment of the first aspect, the apparatus is further caused to update coefficients of the distortion reducing matrix based on minimizing a weighted sum of the error signal of the outputs of the power amplifiers and the error signal of the total input power to the power amplifiers with a least mean square algorithm.

According to an example embodiment of the first aspect, the apparatus may be further caused to detect a change in at least one of behaviour of the plurality of power amplifiers, the coupling effect between the plurality of power amplifiers or an ambient environment; and update the coefficients of the distortion reducing matrix in response to the detected change.

According to an example embodiment of the first aspect, the distortion reducing matrix is iteratively trained and the apparatus is caused to set the distortion reducing matrix initially to an identity matrix; and for every iteration round: generate a random channel matrix; calculate the linear precoder based on a channel response determined based on the random channel matrix, a matrix model of the coupling effect and the distortion reducing matrix; generate a random test signal; calculate an output of the distortion reducing matrix based on the calculated linear precoder and the test signal, and apply the output to the power amplifiers; obtain measured outputs of the power amplifiers after the coupling effect; and update coefficients of the distortion reducing matrix based on the measured and calculated values of the iteration round.

According to an example embodiment of the first aspect, the distortion reducing matrix is iteratively trained and the apparatus is caused to set the distortion reducing matrix initially to an identity matrix; determine that a signal-to-noise ratio at outputs of the power amplifiers is below a threshold; and perform iteration rounds while the signal-to-noise ratio is below the threshold, wherein for every iteration round the apparatus is caused to generate a random channel matrix; calculate the linear precoder based on a channel response determined based on the random channel matrix, a matrix model of the coupling effect and the distortion reducing matrix; generate a random test signal; calculate an output of the distortion reducing matrix based on the calculated linear precoder and the test signal; calculate an output of the digital pre-distortion models based on the output of the distortion reducing matrix, and apply the output of the digital pre-distortion models to the power amplifiers; obtain measured outputs of the power amplifiers after the coupling effect; determine if a current iteration round count is divisible by a predetermined positive integer; if the current iteration round count is divisible by the predetermined positive integer, update model coefficients of one of the digital pre-distortion models or the distortion reducing matrix based on the measured and calculated values of the iteration round while maintaining coefficients of one of the distortion reducing matrix or the digital pre-distortion models; and if the current iteration round count is not divisible by the predetermined positive integer, update coefficients of one of the distortion reducing matrix or the digital pre-distortion models based on the measured and calculated values of the iteration round while model coefficients of one of the digital pre-distortion models or the distortion reducing matrix are maintained.

According to an example embodiment of the first aspect, the coefficients of the digital pre-distortion models are updated per power amplifier with a direct learning algorithm based on the measured outputs of the power amplifiers and the output of the distortion reducing matrix with the matrix model for the coupling effect applied.

According to an example embodiment of the first aspect, the coefficients of the digital pre-distortion models are updated per power amplifier with an indirect learning algorithm based on the measured outputs and the output of the digital pre-distortion models with the matrix model for the coupling effect applied.

According to a second aspect, a method is disclosed. The method may comprise: receiving a signal to be transmitted via an array of antennas from a linear precoder, wherein the signal is processed by the linear precoder based on one or more input power criteria for power amplifiers of the array of antennas; applying a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices; and providing an output of the distortion reducing matrix to be used in digital pre-distortion processing of an input signal for the power amplifiers. The method may be performed, for example, by a computing device, a transmitter device, or the apparatus according to the first aspect.

According to an example embodiment of the second aspect, the method further comprises receiving the signal to be processed by the linear precoder and outputting the processed signal to the distortion reducing matrix by the linear precoder; and wherein the one or more criteria comprise equal or fixed input power for the power amplifiers.

According to an example embodiment of the second aspect, the signal is processed by applying an equal power zero-forcing precoding matrix for equal power input to the distortion reducing matrix.

According to an example embodiment of the second aspect, the method comprises processing the output of the distortion reducing matrix based on digital pre-distortion models trained to compensate nonlinear distortion of the power amplifiers; and providing an output of the digital pre-distortion models as the input signal to the power amplifiers.

According to an example embodiment of the second aspect, the distortion reducing matrix is one of a frequency independent matrix, a frequency independent vector, a frequency dependent matrix per a subcarrier or a group of subcarriers or a frequency dependent vector per a subcarrier or a group of subcarriers.

According to an example embodiment of the second aspect, the method comprises training the distortion reducing matrix at a startup for all power amplifiers of the array of antennas using random signals and random channel matrices.

According to an example embodiment of the second aspect, the method comprises training the distortion reducing matrix based on minimizing an error signal corresponding to a difference between a measured total input power to the power amplifiers and a total input power provided to the power amplifiers at startup.

According to an example embodiment of the second aspect, the method comprises updating coefficients of the distortion reducing matrix based on minimizing a weighted sum of the error signal of the outputs of the power amplifiers and the error signal of the total input power to the power amplifiers with a least mean square algorithm.

According to an example embodiment of the second aspect, the method comprises detecting a change in at least one of behaviour of the plurality of power amplifiers, the coupling effect between the plurality of power amplifiers or an ambient environment; and updating the coefficients of the distortion reducing matrix in response to the detected change.

According to an example embodiment of the second aspect, the distortion reducing matrix is iteratively trained and the method comprises: setting the distortion reducing matrix initially to an identity matrix; and for every iteration round: generating a random channel matrix; calculating the linear precoder based on a channel response determined based on the random channel matrix, a matrix model of the coupling effect and the distortion reducing matrix; generating a random test signal; calculating an output of the distortion reducing matrix based on the calculated linear precoder and the test signal, and applying the output to the power amplifiers; obtaining measured outputs of the power amplifiers after the coupling effect; and updating coefficients of the distortion reducing matrix based on the measured and calculated values of the iteration round.

According to an example embodiment of the second aspect, the distortion reducing matrix is iteratively trained and the method comprises setting the distortion reducing matrix initially to an identity matrix; determining that a signal-to-noise ratio at outputs of the power amplifiers is below a threshold; and performing iteration rounds while the signal-to-noise ratio is below the threshold, wherein for every iteration round the method comprises generating a random channel matrix; calculating the linear precoder based on a channel response determined based on the random channel matrix, a matrix model of the coupling effect and the distortion reducing matrix; generate a random test signal; calculating an output of the distortion reducing matrix based on the calculated linear precoder and the test signal; calculating an output of the digital pre-distortion models based on the output of the distortion reducing matrix, and applying the output of the digital pre-distortion models to the power amplifiers; obtaining measured outputs of the power amplifiers after the coupling effect; determining if a current iteration round count is divisible by a predetermined positive integer; if the current iteration round count is divisible by the predetermined positive integer, updating model coefficients of one of the digital pre-distortion models or the distortion reducing matrix based on the measured and calculated values of the iteration round while maintaining coefficients of one of the distortion reducing matrix or the digital pre-distortion models; and if the current iteration round count is not divisible by the predetermined positive integer, updating coefficients of one of the distortion reducing matrix or the digital pre-distortion models based on the measured and calculated values of the iteration round while model coefficients of one of the digital pre-distortion models or the distortion reducing matrix are maintained.

According to an example embodiment of the second aspect, the coefficients of the digital pre-distortion models are updated per power amplifier with a direct learning algorithm based on the measured outputs of the power amplifiers and the output of the distortion reducing matrix with the matrix model for the coupling effect applied.

According to an example embodiment of the second aspect, the coefficients of the digital pre-distortion models are updated per power amplifier with an indirect learning algorithm based on the measured outputs and the output of the digital pre-distortion models with the matrix model for the coupling effect applied.

According to a third aspect, a computer program, a computer program product, or a (non-transitory) computer-readable medium is disclosed. The computer program, computer program product, or (non-transitory) computer-readable medium may comprise instructions, which when executed by an apparatus, cause the apparatus at least to perform the method according to the second aspect, or any example embodiment(s) thereof, as provided in the description and/or the claims.

According to a fourth aspect, an apparatus may comprise means for receiving a signal to be transmitted via an array of antennas from a linear precoder, wherein the signal is processed by the linear precoder based on one or more input power criteria for power amplifiers of the array of antennas; means for applying a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices; and means for providing an output of the distortion reducing matrix to be used in digital pre-distortion processing of an input signal for the power amplifiers.

Example embodiments of the present disclosure can thus provide apparatuses, methods, computer programs, computer program products, or computer readable media for improving various aspects of distortion reduction. Any example embodiment may be combined with one or more other example embodiments. These and other aspects of the present disclosure will be apparent from the example embodiment(s) described below. According to some aspects, there is provided the subject matter of the independent claims. Some further aspects are defined in the dependent claims.

DESCRIPTION OF THE DRAWINGS

The accompanying drawings, which are included to provide a further understanding of the example embodiments and constitute a part of this specification, illustrate example embodiments and, together with the description, help to explain the example embodiments. In the drawings.

Like references are used to designate like parts in the accompanying drawings.

DETAILED DESCRIPTION

Figure 1:
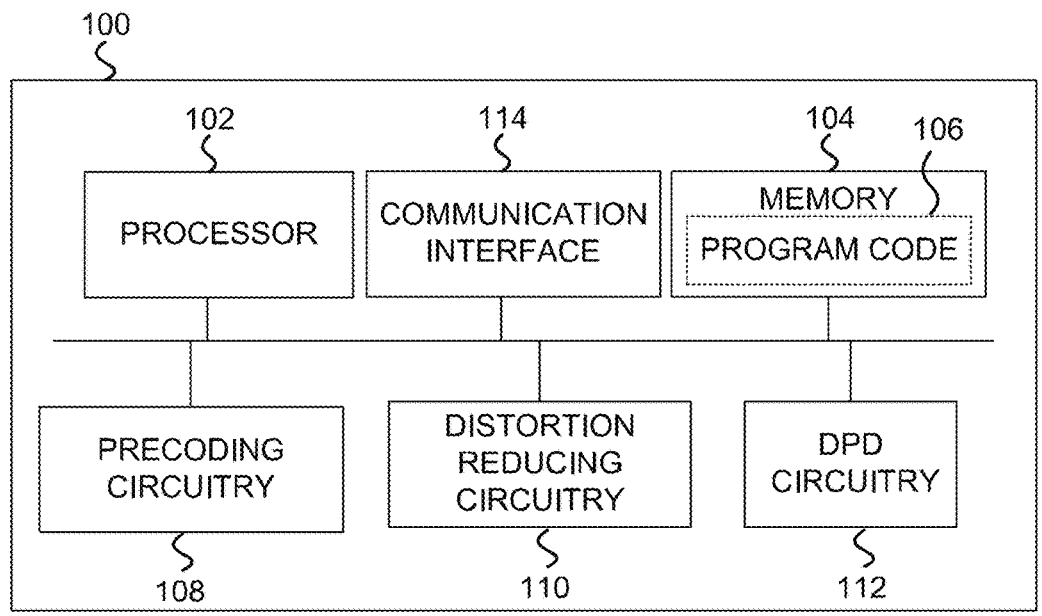
FIG. 1 illustrates an example of an apparatus configured to practice one or more example embodiments.

Reference will now be made in detail to example embodiments, examples of which are illustrated in the accompanying drawings. The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

An adaptive DPD technique provides flexibility and ability to cope with a wide range of deficiencies in most PA and transmitter designs. In adaptive DPD technique, a digital pre-distorter changes a modulated signal to counter the nonlinear effect of PAs, before the signal is converted into analog format using a digital-to-analog converter (DAC). The resulting analog signal is then amplified by a PA. The PA output is sampled and converted into digital format using an analog-to-digital converter (ADC) as a reference signal. A DPD estimator is used to compare the original transmit signal with the digital reference signal in order to adapt the pre-distorter characteristics to compensate for the nonlinearities introduced by the output PA.

In one example, a DPD model may be, for example, based on Volterra series:

$$x_{DPD}(n) = \sum_{p=1}^{P} \sum_{\tau_1=0}^{M_1} \cdots \sum_{\tau_{2p-1}=0}^{M_{2p-1}} a_{\tau_1, \ldots, \tau_{2p-1}} \prod_{j=1}^{p} x(n-\tau_j) \prod_{k=p+1}^{2p-1} x^*(n-\tau_k)$$

In one example, the DPD model may be based on the memory polynomial:

$$x_{DPD}(n) = \sum_{p=1}^{P}\sum_{m=1}^{M} a_{m,p} z_{m,p}(x(n))$$

Where $z_{m,p}(x(n)) = |x(n-m)|^{p-1} x(n-m)$. $x(n)$ is the input signal to the DPD model, and $x_{DPD}(n)$ is the output signal for PAs. In the equation, M denotes for a memory order, P is a nonlinearity order and $\tau$ denotes for delay elements to model memory.

The coefficients of the DPD models may be updated, for example, using a LMS algorithm or a least-squares inversion. For example, in indirect learning with LMS, the DPD coefficients $((\vec{a} = [\alpha_{0,0} \ldots \alpha_{M,0} \ldots \alpha_{M,P}]^T)$ may be updated every iteration is as follows Error signal: $\vec{\varepsilon}_i = \vec{x}_{DPD,i} - Z(y)_i \vec{a}_i$ and coefficient update:

$\vec{a}_{i+1} = \vec{a}_i + \mu \vec{\varepsilon}_i^H Z(y)_i$, where $\vec{x}_{DPD} = [x_{DPD}(n) \ x_{DPD}(n+1) \ldots x_{DPD}(n+N)]^T$, $Z(y) = [\vec{z}_{0,0}(y) \ldots \vec{z}_{M,0}(y) \ldots \vec{z}_{M,P}(y)]$, $\vec{z}_{M,P} = [z_{M,P}(y(n)) \ z_{M,P}(y(n+1)) \ldots z_{M,P}(y(n+N))]^T$ This can be described as $LMS(y, x_{DPD})$. $y(n)$ is the PA output used as the reference signal.

When using the least-squares inversion, the DPD coefficients may be obtained by:

$$\vec{a} = (Z^H Z)^{-1} Z^H \vec{x}_{DPD}$$

In general, there is a wide range of operating temperatures and power ranges that the DPD may need to accommodate for. The power range can change faster than the DPD adaptation time. To overcome this issue, DPDs can store a list of coefficients indexed by power range and/or temperature range.

Massive MIMO is a multi-user MIMO (multiple-input, multiple output) technology than can enable faster data rates. In a massive MIMO system, base stations are equipped with arrays of multiple antennas (and PAs) which can serve many users simultaneously over the same frequencies. The antenna arrays can comprise, for example, tens or hundreds of antennas. Each antenna may be associated with one PA. The users may refer to receivers, such as user devices or user equipment (UEs). For efficient operation, array PA elements operate close to saturation producing non-linear behavior. However, the non-linear behavior of the individual PAs can vary due to element-to-element variation. Also, the outputs of each PA can couple to neighboring PAs or all other PAs in the array.

In massive MIMO, there is a multipath channel response (H) between the transmitter array and the receivers (r). If the channel is perfectly known by the transmitter, the signal (s) can be pre-coded with P so that the interference from signals intended for other users is nulled. This is called zero-forcing (ZF) precoding.

The received signal may be: $\vec{r} = HP\vec{s} + n$, where n represents noise. One example of a ZF precoder is a Moore-Penrose precoder which is a pseudo-inverse of the channel H: $P = H^T(HH^T)^{-1}$. There also exists other types of precoders, such as an equal power precoder which ensures equal power distribution amongst all PAs in a MIMO array. Generally, precoders may not consider PA distortion. In one example, the equal power precoder may be configured to iteratively find a precoder that is zero forcing while ensuring that power input to every PA in an array is the same.

In cases where the number of antennas at the transmitter is larger than the number of users, an ideal precoding matrix may be designed to simultaneously reduce the complexity of the DPD model and still meet the error vector magnitude (EVM) requirements at the receiver.

One approach to find the ideal precoder and DPD combination is to use an iterative adaptation method. In iterative adaptation, DPD coefficients are updated using an indirect learning LMS (LMS(z',y)) and the precoder is updated using LMS (LMS(r, x)), when the EMV at receiver is greater than target EMV. Here, z' represents the input of the adaptive DPD, y the input signal of a PA, r the input of the precoder and x the output of the precoder.

Though the iterative adaptation approach may achieve a reduction in DPD complexity, the approach is dependent on the channel/user group and requires re-iterative retraining whenever the channel or the user group changes. Therefore, the retraining may need to be performed often. Further, the retraining process consumes additional power and significantly slows down DPD adaptation time because the DPD would need to be retrained every time the channel changes as well. In addition, the additional training requires additional circuitry/area on a chip and introduces delays.

DPD module may be the largest power consumer in a digital front end (DFE) for a massive MIMO system on a chip (SoC). The large power consumption is primarily caused due to multipliers and adders required to calculate higher non-linearity orders and memory orders. Reducing the complexity of the DPD, by reducing non-linearity order and memory order, enables lower power consumption, smaller area required on the SoC, faster processing time and faster DPD adaptation time.

Reducing DPD complexity may enable lower power consumption in DPD processing stage, DPD training stage and storage stage. In the processing stage, reducing complexity means that fewer multipliers/adders are running which translates to lower power consumption. In the training stage, fewer DPD coefficients means that the size of the square matrix to be inverted is also greatly reduced, which significantly reduces power consumption. In the storage stage, fewer coefficients would need to be stored in the coefficient list and therefore would need less power to maintain.

Reducing DPD complexity may enable to reduce the area required in the DPD processing stage, the DPD training stage and the storage stage. In the processing stage, reducing complexity means fewer multipliers/adders are required and therefore the size of the DPD processing module is smaller. In the training stage, fewer DPD coefficients means fewer circuitry required to calculate the coefficients, and therefore a smaller DPD training module. In the storage stage, fewer coefficients would need to be stored in the coefficient list and therefore would need less area to maintain.

Reducing DPD complexity may enable to speed up processing in the DPD processing stage and the DPD training stage. In the processing stage, reducing complexity means that fewer multipliers/adders are required to calculate each output, and therefore the output is available faster. In the training stage, fewer DPD coefficients means that the size of the square matrix to be inverted is also greatly reduced, and therefore the coefficients can be calculated faster. Therefore, the DPD adaptation time is sped up.

An objective is to reduce distortion at PA outputs and reduce DPD model complexity without requiring frequent retraining for every channel. This may be achieved by introducing a distortion reducing matrix (D matrix) in a signal processing chain of a transmitter after a precoding matrix and before the DPD module. The D matrix is designed to reduce the distortion at each PA output by minimizing an error signal of a measured and a desired output of the PAs.

The D matrix may depend only on the hardware: the PA distortion and the PA array coupling behavior described by matrix C. The D matrix may be trained at startup for all the PAs in the array using random signals and channel matrices. The D matrix may only need to be updated if the PA behavior or coupling between the PAs changes, such as with temperature changes, aging, or the like. The D matrix can be updated during regular operation without interruption to account for slow moving changes such as temperature, aging, or the like. In one example, the D matrix may be used in conjunction with an equal power precoding matrix P to generate signals that optimize distortion performance at PA output whilst still meeting EVM requirements at receiver. However, it is noted that the D matrix may be used in conjunction with any precoder with a fixed or known power per PA. In general, the precoder may be configured to process the signal to be input to the D matrix based on one or more input power criteria for the power amplifiers. The one or more criteria may comprise, for example, equal power or fixed power per PA.

FIG. 1 illustrates an example of an apparatus configured to practice one or more example embodiments. Apparatus 100 may comprise a device such as a transmitter device, a signal processing device, a base station, a network device, or in general any apparatus configured to implement functionality described herein. In one example, apparatus 100 may be configured for MIMO communications. Apparatus 100 may comprise at least one processor 102. The at least one processor 102 may comprise, for example, one or more of various processing devices, such as for example a co-processor, a microprocessor, a controller, a digital signal processor (DSP), a processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like.

Apparatus 100 may further comprise at least one memory 104. The memory 104 may be configured to store, for example, computer program code or the like, for example operating system software and application software. The memory 104 may comprise one or more volatile memory devices, one or more non-volatile memory devices, and/or a combination thereof. For example, the memory 104 may be embodied as magnetic storage devices (such as hard disk drives, magnetic tapes, etc.), optical magnetic storage devices, or semiconductor memories (such as mask ROM, PROM (programmable ROM), EPROM (erasable PROM), flash ROM, RAM (random access memory), etc.). The memory 104 is provided as an example of a (non-transitory) computer readable medium. The term "non-transitory," as used herein, is a limitation of the medium itself (i.e., tangible, not a signal) as opposed to a limitation on data storage persistency (e.g., RAM vs. ROM).

Apparatus 100 may further comprise a communication interface 114 configured to enable apparatus 100 to transmit and/or receive information. Communication interface 114 may comprise an external communication interface, such as for example a radio interface between one or more users, such as user equipment (UEs). Communication interface 114 may comprise one or more radio transmitters or receivers, which may be coupled to one or more antennas or apparatus 100, or be configured to be coupled to one or more antennas external to apparatus 100.

Apparatus 100 may comprise a plurality of antennas, which may be referred to as an antenna array. Number of antennas in the antenna array may be greater than number of receivers served by the antenna array. Apparatus 100 may further comprise a plurality of PAs, or an PA array, associated with the antenna array. Apparatus 100 may be configured to reduce distortion at the PA array with a distortion reducing matrix arranged to process signals between processing performed by a precoding matrix and DPD modules of the PAs.

Apparatus 100 may comprise a precoding circuitry 108. For example, the precoding circuitry 108 may comprise a linear precoder, such as a zero-forcing precoder, configured to receive a signal to be transmitted via the antenna array and process the signal based on an equal power precoding matrix configured to provide equal power input to the distortion reducing matrix. Alternatively, the apparatus 100 may comprise a linear precoder (e.g., a zero forcing precoding matrix) configured to provide fixed power to each PA, wherein the fixed power values may not be equal values between PAs.

Apparatus 100 may comprise a distortion reducing circuitry 110. The distortion reducing circuitry 110 may be configured to receive the signal processed by the precoding matrix and apply a distortion reducing matrix to the processed signal. The distortion reducing matrix may be trained to reduce distortion at each output of the PAs by minimizing an error signal corresponding to a difference between a measured and calculated output of the PAs based on the processed signal. The outputs of the PAs may be measured such that a coupling effect between the PAs is considered. In calculations, the coupling effect may be modelled with a model matrix of the coupling effect. The distortion reducing circuitry 110 may further comprise a training circuitry configured to perform the training based on the received feedback of the PA outputs and to update coefficients of the distortion reducing matrix based on the feedback. In general, the distortion reducing circuitry 110 may be configured to receive as an input a signal processed by a linear or zero forcing precoder and wherein the input signal is configured to provide equal power, or known power, for each PA. In one example, the modified input signal for the distortion reducing circuitry 110 can be provided by the precoding circuitry 108.

In one example, the apparatus 100 may be a signal processing device comprising at least the distortion reducing circuitry 110. In one example, the apparatus 100 may comprise at least the precoding circuitry 108 and the distortion reducing circuitry 110. The precoding circuitry 108 and the distortion reducing circuitry 110 may be configured to receive a signal to be transmitted via an antenna array and perform distortion reducing precoding before the signal is input for DPD of PAs of the antenna array.

Apparatus 100 may further comprise one or more DPD circuitries 112 configured to compensate for distortion introduced by nonlinearities of the PAs. The one or more DPD circuitries 112 may be configured to receive the output of the distortion reducing matrix as an input, and process the input with a DPD model before the signal enters the PAs. The DPD model may be configured to perform the compensation by distorting the input signal such that, after passing through the PA, the distortions introduced by the amplifier itself may be cancelled out. The DPD circuitry 112 may be also referred to as a DPD module or DPD block. The DPD circuitry 112 may further comprise a training circuitry configured to receive feedback from the PA outputs, and refine the DPD model based on the feedback.

Apparatus 100 may further comprise other components and/or functions such as a user interface (not shown) comprising at least one input device and/or at least one output device. The input device may take various forms such as a keyboard, a touch screen, or one or more embedded control buttons. The output device may for example comprise a display, a speaker, or the like.

When apparatus 100 is configured to implement some functionality, some component and/or components of apparatus 100, such as for example the at least one processor 102 and/or the at least one memory 104, may be configured to implement this functionality. Furthermore, when the at least one processor 102 is configured to implement some functionality, this functionality may be implemented using program code 106 comprised, for example, in the at least one memory 104.

The functionality described herein may be performed, at least in part, by one or more computer program product components such as software components. According to an example embodiment, apparatus 100 comprises a processor or processor circuitry, such as for example a microcontroller, configured by the program code 106, when executed, to execute the embodiments of the operations and functionality described herein. Program code 106 is provided as an example of instructions which, when executed by the at least one processor 102, cause performance of apparatus 100.

Alternatively, or in addition, the functionality described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), graphics processing units (GPUs), or the like.

Apparatus 100 may be configured to perform, or cause performance of, method(s) described herein or comprise means for performing method(s) described herein. In one example, the means comprises the at least one processor 102, the at least one memory 104 including instructions (e.g., program code 106) configured to, when executed by the at least one processor 102, cause apparatus 100 to perform the method(s). In general, computer program instructions may be executed on means providing generic processing functions. Such means may be embedded for example in a personal computer, a smart phone, a network device, or the like. The method(s) may be thus computer-implemented, for example based on algorithm(s) executable by the generic processing functions, an example of which is the at least one processor 102. The means may comprise transmission or reception means, for example one or more radio transmitters or receivers, which may be coupled or be configured to be coupled to one or more antennas. Apparatus 100 may comprise, for example, a network device, for example, an access node, an access point, a base station, or a central/distributed unit thereof. The base station may be, for example, a 5$^{th}$ generation nodeB (gNB). Although apparatus 100 is illustrated as a single device, it is appreciated that, wherever applicable, functions of apparatus 100 may be distributed to a plurality of devices.

Figure 2:
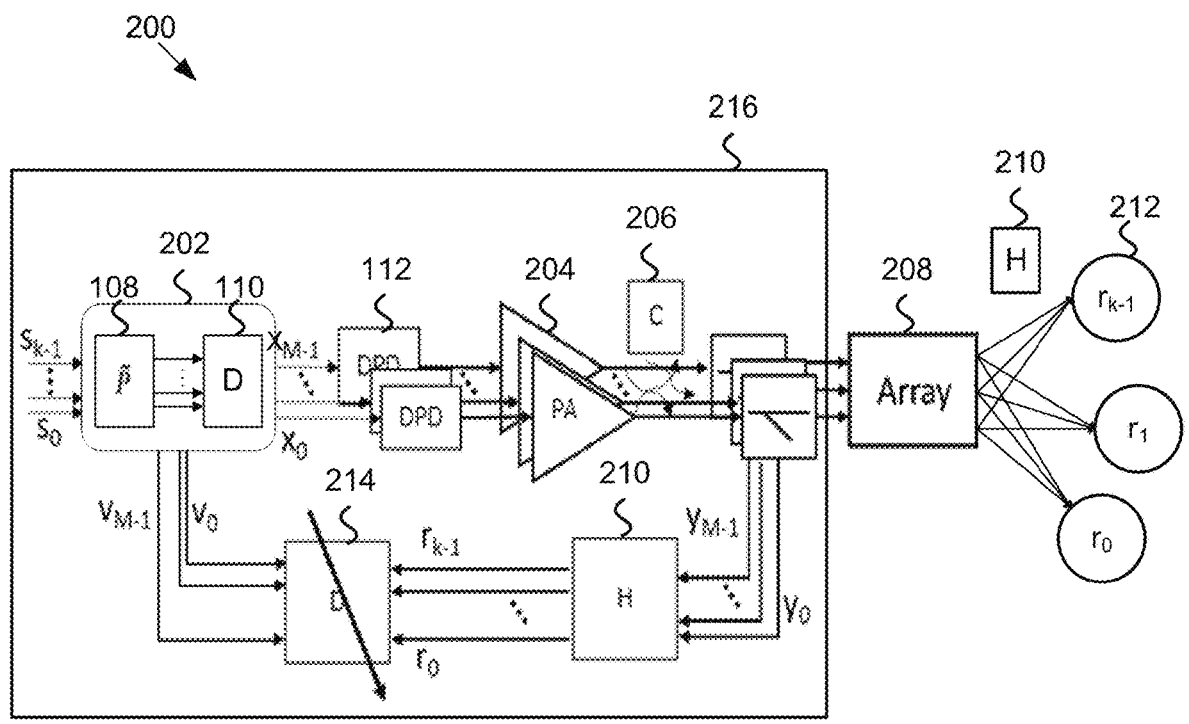
FIG. 2 illustrates an example of a MIMO system with a transmitter device configured to perform distortion reduction before digital predistortion.

FIG. 2 illustrates an example of a MIMO system 200 comprising a transmitter device 216 configured to perform distortion reduction before digital predistortion of PAs. In the MIMO system 200, the transmitter device 216 may be configured to process a signal to be transmitted via an antenna array 208, to one or more receivers 212. The antenna array 208 may comprise more antennas than users (M>K, where M is the number of antennas and K is the number of users served by the antennas). The users may be represented by the receivers 212, or receiver devices, such as UEs. The transmitter device 216 may comprise a PA array 204 configured to generate amplified output signals for the antenna array. The transmitter device 216 may be configured to perform DPD for each PA. A multipath channel between the antenna array 208 and the receivers 212 may be represented with a channel matrix H 210.

In such MIMO systems, there may be more than one precoder (e.g., zero forcing precoder) that can meet EVM constraints at the receivers. Therefore, there may exist an "ideal" precoder which can simultaneously meet EVM requirements at the receiver and improve distortion at individual PA outputs, thereby reducing the DPD complexity.

The transmitter device 216 may comprise a precoder P 202 designed to operate as the ideal precoder. The precoder P 202 may comprise a linear precoder. The precoder P 202 can be decomposed into a channel and/or receiver group dependent precoding matrix P and a channel independent distortion reducing D matrix. The precoding matrix P may be operated by a precoding circuitry 108. The precoding matrix P may be, for example, an equal power precoding matrix configured to perform zero-forcing precoding while keeping input power for each PA approximately equal. Zero-forcing precoding is one example of linear precoding. Instead of equal power values, the precoding circuitry 108 may be configured to keep the input power for each PA at fixed values. Hence, the precoding matrix P may be configured to perform precoding based on one or more input power criteria for the PAs. The distortion reduction D matrix may be operated by a distortion reducing circuitry 110. The D matrix can be a square M×M matrix, a M×1 vector or a M×M×F matrix where F is the number of subcarriers or subcarrier groups. With this approach, there may not need to be any iterative retraining of the D matrix for channel/user group changes.

The precoder P 202 may be configured to receive a signal $\vec{s} = [s_0, \ldots, s_{k-1}]$ and process the signal with the precoding matrix $\tilde{P}$ and the D matrix. An output $\vec{x} = [x_0, \ldots, x_{M-1}]$ of the D matrix is fed to DPD circuitries 112 of the transmitter device 216 configured to compensate for distortion of the PA array 204. The DPD circuitries 112 may be configured to provide input signal for the PAs based on configured DPD models. The DPD models may be based on, for example, the Volterra series, the memory polynomial, a piece-wise algorithm, or neural networks. The distortion reducing circuitry 110 may be configured on a same chip as the precoding circuitry 108. Alternatively, the distortion reducing circuitry 110 may be configured on a same chip as the DPD circuitries 112.

The precoder 202, e.g. the distortion reducing circuitry 110, may be configured to monitor at least one of an input power or an output power of each of the PAs. Based on the monitored power, and associated distortion at PA outputs, the distortion reducing circuitry 110 may detect if one or more PAs have more distortion than the other PAs. Based on the detection, the distortion reducing circuitry 110 may modify the power level of the one or more PAs to lower distortion. The precoding circuitry 108 may be configured to provide equal power input for each of the PAs. In other words, the distortion reducing circuitry 110 may be configured to ensure equal power distortion at each PA output. This can be performed with the zero-forcing equal power precoding matrix $\tilde{P}$ by processing the signal $\vec{s}$ such that the same power is allocated per PA. For example, based on the monitored power, precoding weights of the equal power precoding matrix may be updated to ensure the equal power. In addition, or alternatively, the precoding weights may be updated based on one or more preconfigured power constraints. If zero-forcing precoding was performed without considering equal power, different PAs could contribute differently to the distortion. However, with equal power zero-forcing precoding, different PAs may contribute almost equal amounts of nonlinear distortion.

In one example, the equal power precoding matrix may be iteratively calculated. For every iteration:

1) a candidate equal power precoder $\tilde{P}$ may be calculated based on the channel H and a diagonal matrix W with weights (originally W is the Identity matrix I)
2) The power of each output from the candidate $\tilde{P}$ may be calculated (sum of squares of each row).
3) W may be scaled proportionally by the output powers (divide each row by square root of output powers calculated in step 2).

Eventually, the end result may be a candidate $\tilde{P}$ that has equal output powers.

The outputs of each PA can couple to neighboring PAs or all other PAs in the PA array. The coupling effect can be modelled with a matrix model C 206. The outputs $\vec{y} = [y_0, \ldots, y_{M-1}]$ of the PAs may be sampled via a feedback path to form an error signal. The feedback path may be selected such that the sampled outputs take into account the coupling effect.

The sampled outputs $\vec{y}$ may be fed to a training circuitry 214 of the distortion reducing D matrix. The training circuitry 214 may be configured to update coefficients of the D matrix. For example, the outputs $\vec{y}$ may be applied to the channel matrix H 210 to derive received signals $r_0, \ldots, r_{k-1}$ of the receivers. The training circuitry 214 may further receive output signals $v_0, \ldots, v_{M-1}$ of the precoding matrix $\tilde{P}$, e.g., the signal $\vec{s}$ after the matrix $\tilde{P}$ is applied. Based on the output signals and the derived received signals, the training circuitry 214 may be configured to determine an error signal for a desired and measured output of the PAs, and update coefficients of the D matrix. The error signal may be calculated as $\vec{\varepsilon_2} = \vec{y} - CD_i\tilde{P}\vec{s}$, wherein $CD_i\tilde{P}\vec{s}$ represents what the output of the PAs should be.

The precoding circuitry 108 may be configured to operate as a zero-forcing precoder responsible for meeting required SNR (signal-to-noise ratio) at receiver. The ZF precoder may be channel dependent. Hence, the precoding matrix $\tilde{P}$ may be recalculated whenever the channel and/or receiver group changes.

The distortion reducing D matrix may be channel independent such that coefficients of the distortion reducing matrix D may depend on PA distortion and PA array coupling behavior. The D matrix may be responsible for reducing sum of SNRs at PA outputs ($\vec{\varepsilon_2} = \vec{y} - CD_i\tilde{P}\vec{s}$).

However, D=0 is also a solution since it will null the distortions at PA outputs. Therefore, a power constraint may be introduced to keep total input power to PA array constant. The total input power may be kept constant by minimizing an error $$\varepsilon_{power} = \sum_{m=0}^{M-1} x_m^2 - K,$$

where $$K = \sum_{m=0}^{M-1} x_m^2$$

at initial startup with D=I. The D matrix may be trained at startup for all the PAs in the array using random signals and channel matrices. The training may be performed by minimizing the weighted sum of the errors $\varepsilon_2$ and $\varepsilon_{power}$:

$$J = |\vec{\varepsilon_2}|^2 + \gamma \varepsilon_{power}^2 = tr\{\vec{\varepsilon_2}\vec{\varepsilon_2}^H\} + \gamma(tr\{\vec{x}\vec{x}^H\} - K)^2 = tr\{(\vec{y} - CD\tilde{P}\vec{s})\vec{y}^H - \vec{s}^H\tilde{P}^HD^HC^H\} + \gamma(tr\{D\tilde{P}\vec{s}\vec{s}^H\tilde{P}^HD^H\} - K)^2$$

where $\gamma$ is a weight for the error $\varepsilon_{power}$.

Taking the derivative of J with respect to D*

$$\frac{\partial J}{\partial D^*} = C^H\vec{y}\vec{s}^H\tilde{P}^H + C^HCD\tilde{P}\vec{s}\vec{s}^H\tilde{P}^H + 2\gamma(tr\{\vec{x}\vec{x}^H\} - K)D\tilde{P}\vec{s}\vec{s}^H\tilde{P}^H = -C^H\vec{\varepsilon_2}v^H + 2\gamma\varepsilon_{power}Dvv^H$$

Therefore, a LMS update equation for D may be given as:

$$D_{i+1} = D_i + \beta C^H\vec{\varepsilon_2}v^H - \alpha\varepsilon_{power}D_ivv^H$$

where $\beta$ is a step size in the LMS algorithm.

The D matrix may be trained at start-up of the transmitter device 216 for all PAs in the array across different channels and/or receiver combinations. Initially, D may be set to the identity matrix I ($D_0=I$). The training assumes the coupling matrix model C 206 is already known. For every iteration round during training, the transmitter device 216 may be configured to perform the following:

1) A random channel matrix H is generated.
2) A precoding matrix $\tilde{P}$ is calculated considering $HCD_i$ as the channel response.
3) A test signal $\vec{s}$ is generated and $\vec{x}$ is calculated and applied to the PA array.
4) The PA outputs $\vec{y}$ are measured.
5) D is updated: $D_{i+1} = D_i + \beta C^H\vec{\varepsilon_2}v^H - \alpha\varepsilon_{power}D_ivv^H$.

The update equations will be slightly different depending on whether D is a frequency independent matrix (M×M matrix), a frequency independent vector (M×1 vector), a frequency dependent matrix (M×M×F matrices) or a frequency dependent vector (M×1×F) where F is the number of subcarriers or groups of subcarriers.

For a frequency independent matrix, the weighted sum of the two errors may be minimized as follows:

$$J = \sum_{f=1}^{N}|\vec{\varepsilon_2}(f)|^2 + \gamma\varepsilon_{power}^2 = \sum_{f=1}^{N}\vec{\varepsilon_2}^H(f)\vec{\varepsilon_2}(f) + \gamma\left(\sum_{f=1}^{N}\vec{x}^H(f)\vec{x}(f) - K\right)^2 =$$

$$\sum_{f=1}^{N}\left(\vec{y}^H(f) - \vec{s}^H(f)\tilde{P}^H(f)D^HC^H(f)\right)\left(\vec{y}(f) - C(f)D\tilde{P}(f)\vec{s}(f)\right) +$$

$$2\gamma\varepsilon_{power}\sum_{f=1}^{N}\vec{s}^H(f)\tilde{P}^H(f)D^HD\tilde{P}(f)\vec{s}(f)$$

Taking the derivative of J with respect to D*

$$\frac{\partial J}{\partial D^*} =$$

$$\sum_{f=1}^{N}\left(-C^H(f)\vec{y}(f)\vec{s}^H(f)\tilde{P}^H(f) + C^H(f)C(f)D\tilde{P}(f)\vec{s}(f)\vec{s}^H(f)\tilde{P}^H(f)\right) +$$

$$2\gamma\varepsilon_{power}\sum_{f=1}^{N}D\tilde{P}(f)\vec{s}(f)\vec{s}^H(f)\tilde{P}^H(f) =$$

$$\sum_{f=1}^{N}\left(-C^H(f)\vec{\varepsilon_2}(f)v^H(f)\right) + 2\gamma\varepsilon_{power}\sum_{f=1}^{N}\left(Dv(f)v^H(f)\right)$$

Therefore, the LMS update equation for D is:

$$D_{i+1} = D_i + \beta\sum_{f=1}^{N}\left(-C^H(f)\vec{\varepsilon_2}(f)v^H(f)\right) - \alpha\varepsilon_{power}\sum_{f=1}^{N}\left(D_iv(f)v^H(f)\right)$$

For a frequency dependent matrix, the weighted sum of the two errors may be minimized as follows:

$$J = \sum_{f=1}^{N}|\vec{\varepsilon_2}(f)|^2 + \gamma\varepsilon_{power}^2 = \sum_{f=1}^{N}\vec{\varepsilon_2}^H(f)\vec{\varepsilon_2}(f) + \gamma\left(\sum_{f=1}^{N}\vec{x}^H(f)\vec{x}(f) - K\right)^2 =$$

$$\sum_{f=1}^{N}\left(\vec{y}^H(f) - \vec{s}^H(f)\tilde{P}^H(f)D^H(f)C^H(f)\right)\left(\vec{y}(f) - C(f)D(f)\tilde{P}(f)\vec{s}(f)\right) +$$

$$2\gamma\varepsilon_{power}\sum_{f=1}^{N}\vec{s}^H(f)\tilde{P}^H(f)D^H(f)D(f)\tilde{P}(f)\vec{s}(f)$$

Taking the derivative of J with respect to D*(f)

$$\frac{\partial J}{\partial D^*(f)} =$$

$$\left(-C^H(f)\vec{y}(f)\vec{s}^H(f)\tilde{P}^H(f) + C^H(f)C(f)D(f)\tilde{P}(f)\vec{s}(f)\vec{s}^H(f)\tilde{P}^H(f)\right) +$$

$$2\gamma\varepsilon_{power}\sum_{f=1}^{N}D(f)\tilde{P}(f)\vec{s}(f)\vec{s}^H(f)\tilde{P}^H(f) =$$

$$\left(-C^H(f)\vec{\varepsilon_2}(f)v^H(f)\right) + 2\gamma\varepsilon_{power}\left(D(f)v(f)v^H(f)\right)$$

Therefore, the LMS update equation for D is:

$$D_{i+1}(f) = D_i(f) + \beta C^H(f)\vec{\varepsilon_2}(f)v^H(f) - \alpha\varepsilon_{power}D_i v(f)v^H(f)$$

For a frequency independent vector, the derivation for each error ($\varepsilon_2$ and $\varepsilon_{power}$) may be divided into:

$$J_{\varepsilon_2} = \sum_{f=1}^{N}\sum_{q=1}^{M}\left(\left(y_q(f) - \sum_{m=1}^{M}c_{q,m}(f)d_m\sum_{k=1}^{K}p_{m,k}(f)s_k(f)\right)\right.$$

$$\left.\left(y_q(f) - \sum_{m=1}^{M}c_{q,m}(f)d_m\sum_{k=1}^{K}p_{m,k}(f)s_k(f)\right)^*\right) =$$

$$\sum_{f=1}^{N}\sum_{q=1}^{M}\left(\left(y_q(f) - \sum_{m=1}^{M}c_{q,m}(f)d_m v_m(f)\right)\right.$$

$$\left.\left(y_q^*(f) - \sum_{m=1}^{M}c_{q,m}^*(f)d_m^* v_m^*(f)\right)\right) =$$

$$\frac{\partial J}{\partial d_j^*} = -\sum_{f=1}^{N}\sum_{q=1}^{M}\left(\left(y_q(f) - \sum_{m=1}^{M}c_{q,m}(f)d_m v_m(f)\right)\left(c_{q,j}^*(f)v_j^*(f)\right)\right) =$$

-continued $$-\sum_{f=1}^{N}\sum_{q=1}^{M}\varepsilon_q(f)c_{q,j}^*(f)v_j^*(n) = -\sum_{f=1}^{N}\sum_{q=1}^{M}c_{q,j}^*(f)\varepsilon_q(f)v_j^*(f) =$$

$$-\sum_{f=1}^{N}c_{:,j}^H(f)\varepsilon(f)v_j^*(f) = -\sum_{f=1}^{N}\hat{\varepsilon}_j(f)v_j^*(f)$$

Where $c_{:,j}(f)$ is the jth column of the coupling matrix at subcarrier f and $\varepsilon=[\varepsilon_1, \varepsilon_2, \ldots, \varepsilon_M]^T$ is a column vector and $\hat{\varepsilon}_j(f) = c_{:,j}^H(f)\varepsilon(f)$ $$\frac{\partial J}{\partial d_j^*} = -\sum_{f=1}^{N}\hat{\varepsilon}_j(f)v_j^*(f)$$

Assemble $D=[d_1, d_2, \ldots, d_M]^T$ as a column vector and $$\frac{\partial J}{\partial D^*} = \left[\frac{\partial}{\partial d_1^*}, \frac{\partial}{\partial d_2^*}, \ldots, \frac{\partial}{\partial d_M^*}\right]^T$$

is a column vector. Therefore, $$\frac{\partial J}{\partial D^*} = -\sum_{f=1}^{N}\hat{\varepsilon}(f).*v^*(f)$$

Where $\hat{\varepsilon}(f) = C(f)^H \varepsilon(f)$ and .* is element-wise multiplication.

$$J_{\varepsilon_{power}} = \varepsilon_{power}^2 = \left(\sum_{m=1}^{M}\sum_{f=1}^{N}x_m(f)^2 - K\right)^2 =$$

$$\left(\sum_{m=1}^{M}\sum_{f=1}^{N}\left(d_m\sum_{k=1}^{K}p_{m,k}(f)s_k(f)\right)\left(d_m^*\sum_{k=1}^{K}p_{m,k}^*(f)s_k^*(f)\right) - K\right)^2 =$$

$$\left(\sum_{m=1}^{M}\sum_{f=1}^{N}(d_m v_m(f))(d_m^* v_m^*(f)) - K\right)^2$$

$$\frac{\partial J}{\partial d_j^*} = 2\varepsilon_{power}\sum_{f=1}^{N}\left(d_j v_j(f)v_j^*(f)\right)$$

Therefore, $$\frac{\partial J}{\partial D^*} = 2\varepsilon_{power}\sum_{f=1}^{N}D.*v(f).*v^*(f)$$

Where .* is element-wise multiplication.

Therefore, the LMS update equation for frequency independent D vector is:

$$D_{i+1} = D_i + \beta\sum_{f=1}^{N}C(f)^H \varepsilon_2(f).*v^*(f) - \alpha\varepsilon_{power}\sum_{f=1}^{N}D_i.*v(f).*v^*(f)$$

The derivation is similar for a frequency dependent vector, for which the LMS update equation may be as follows:

$$D_{i+1}(f) = D_i(f) + \beta C^H(f)\varepsilon_2(f).*v^*(f) - \alpha\varepsilon_{power}D_i(f).*v(f).*v^*(f).$$

After the D matrix is trained, the D matrix may be fixed such that only the precoding matrix $\tilde{P}$ is calculated when at least one of the channel or receiver group changes. During regular operation of the transmitter device 216, the distortion reducing D matrix can be updated as PA behavior or ambient environment changes without interruption to signal transmission. The update equation is the same as used for training, depending on the form of the D matrix. Changes in the PA behavior or the ambient environmental changes may be detected, for example, based on changes in the error signal $\varepsilon_2$.

The cascaded effect of precoding matrix $\tilde{P}$ and D matrix may correspond to the ideal precoder which simultaneously ensures adequate EVM at the receiver and reduced distortion at PA outputs. Since the D matrix is helping reduce distortion, the complexity (memory order, non-linearity order) of the DPD circuitries can be reduced significantly. This, in turn, reduces total power consumption of the transmitter device 216 and the MIMO system 200.

Figure 3:
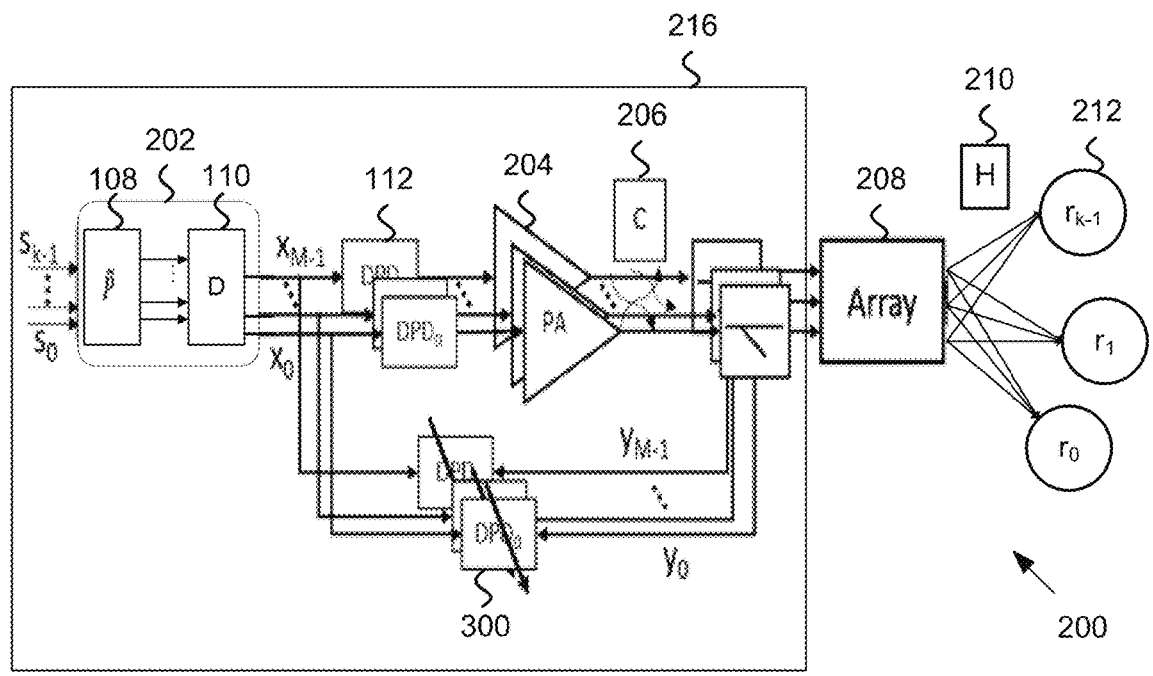
FIG. 3 illustrates an example of a MIMO system with a transmitter device configured for distortion reduction and direct DPD training.

FIG. 3 illustrates an example of a MIMO system 200 with a transmitter device 216 configured to perform distortion reduction and direct DPD training. Precoder 202, DPD circuitries 112, PA array 204, model matrix C 206 of coupling effect and channel matrix H 210 of the transmitter device 216 may operate as described in FIG. 2, and their operations are therefore not repeated here. The transmitter device 216 may be configured to operate in a MIMO system 200 with more antennas than users (M>K). The transmitter device 216 is configured to process signals to be transmitted via an antenna array 208 to one or more receivers 212. The signals may be first processed by the precoding circuitry 108 and the distortion reducing circuitry 110 of the precoder 202. The distortion reducing D matrix may be trained, and coefficients of the D matrix are fixed. Now that the D matrix is set, the DPD circuitries 112 can be trained by the transmitter device 216 using either a direct or indirect training method.

The DPD models may be updated, for example, with a training circuitry 300 configured for indirect learning. The training circuitry 300 may be configured to receive the sampled outputs of the PAs $\vec{y}$ and the output $\vec{x}$ of the D matrix. Based on the signals $\vec{y}$ and $\vec{x}$, the training circuitry 300 may be configured to determine an error signal and update coefficients of the DPD models in order to adapt the predistorter characteristic to compensate for the nonlinearities introduced by the output PA. The update may be performed, for example, using a LMS method or least-squares inversion.

For example, the training circuitry 300 may be configured to update the DPD coefficients with LMS by calculating:

$$\vec{a}_{i+1} = \vec{a}_i + \mu \left( \overrightarrow{x_{DPD}^c} - Z(\vec{y})\vec{a}_i \right)^H Z(\vec{y})$$

where $\overrightarrow{x_{DPD}^c}$ is output of the DPD, $\overrightarrow{x_{DPD}}$, with coupling model matrix C applied.

The D matrix enables to reduce DPD complexity which in turn reduces DPD power consumption. Further, a chip area needed to implement the DPD may be reduced. In addition, DPD processing time may be improved without introducing additional re-training process for every channel.

Figure 4:
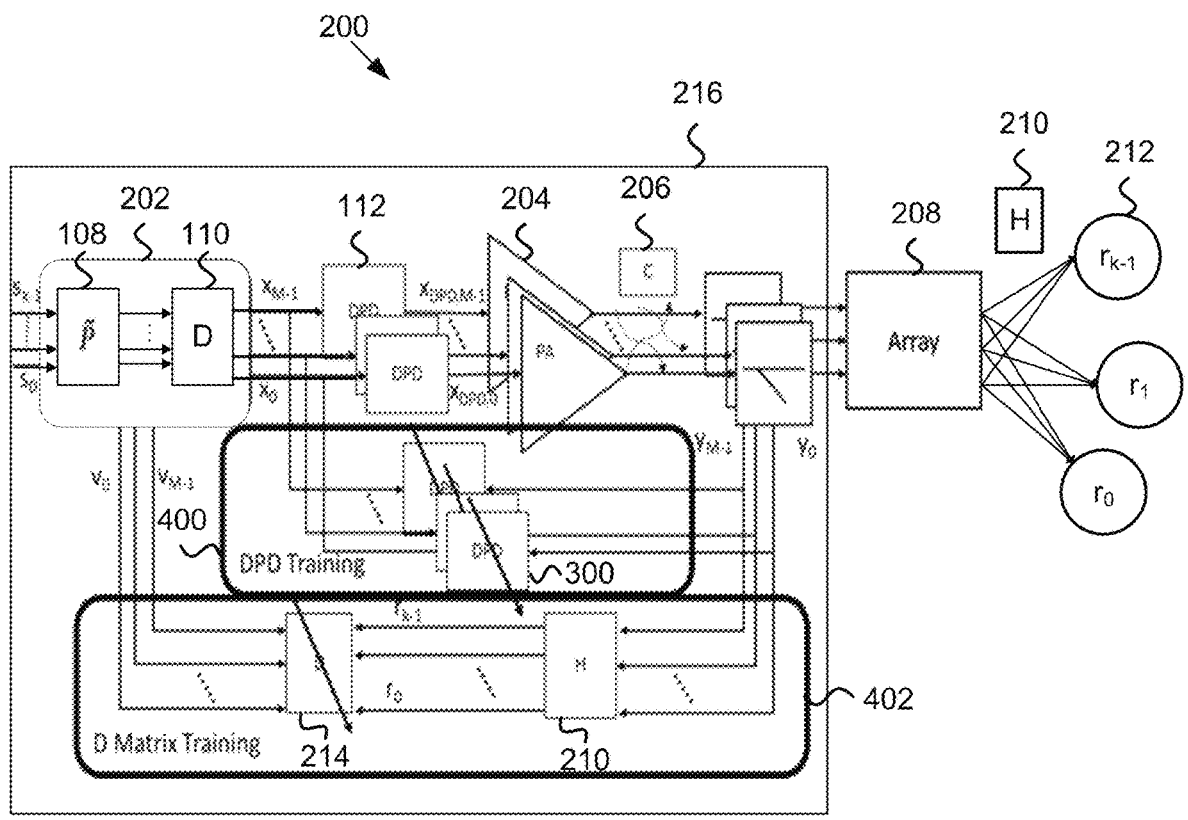
FIG. 4 illustrates an example of a MIMO system with iterative training of a distortion reducing matrix and direct DPD training.

FIG. 4 illustrates an example of a MIMO system with iterative training of a distortion reducing matrix and direct DPD training. The MIMO system 200 may comprise the elements of the MIMO systems 200 as described in FIG. 2 and FIG. 3, but wherein the transmitter device 216 is configured to perform alternating iterative training for the DPD models and the D matrix. For example, the transmitter device 216 may be configured to receive a signal, to be transmitted via the antenna array 208, by the precoder 202. The precoder 202 may comprise the precoding circuitry 108 and the distortion reducing circuitry 110. The precoder 202 is configured to process the signal by first applying the precoding matrix P (e.g. equal or fixed power precoding matrix) and then the matrix D. The processed signal is then inputted to DPD circuitries 112 for further processing to compensate for nonlinearities introduced by the PA array 204. The PAs may be configured to receive input from the DPD circuitries 112, and amplify the input before the signal is transmitted by the antenna array 208 to receivers 212. The transmitter device may be further configured to store and/or generate the model matrix C 206 representing coupling effect between outputs of the PAs 204 and the channel matrix H 210 representing characteristics of the propagation environment between the transmitter and the receivers.

Further, the transmitter device 216 may comprise a first feedback or training loop 400 for the DPD models and a second feedback or training loop 402 for the D matrix. The first feedback loop 400 may comprise the training circuitry 300 for DPD. The training circuitry 300 may be configured to update the DPD model coefficients either by indirect learning or direct learning. The second feedback loop may comprise the training circuitry 214 for D matrix and the channel matrix H 210. The first and the second feedback loops 400, 402 may be configured to update the respective coefficients by taking turns according to predefined criteria. For example, the coefficients may be iteratively trained until SNR at the PA outputs is at a desired level and a decision on which of the coefficients are updated (DPD or D) may be based on an iteration round count number.

For example, the distortion reducing matrix D and DPD models can be trained iteratively at start-up for all PAs in array across different channels and/or receiver combinations. Initially, the D matrix may be set to the identity matrix I ($D_0$=I) and the DPD circuitries are pass through. The training assumes the model matrix C of the coupling effect is already known. Then, the transmitter device 216 may be configured to alternate between updating/training the matrix D and the DPD models.

The training procedure may be configured to continue while SNR at the PA outputs is below a threshold as follows:
1) A random channel matrix H is generated.
2) A precoding matrix $\tilde{P}$ is calculated considering $HCD_i$ as the channel response.
3) A test signal $\vec{s}$ is generated and $\vec{x}$ is calculated.
4) $\overrightarrow{x_{DPD}}$ is calculated and applied to the PA array.
5) The PA outputs $\vec{y}$ are measured.
If iteration round count i is divisible by J:
6) The DPD coefficients are updated per PA-$\overrightarrow{x^c}$ For direct learning: $\vec{a}_{i+1} = \vec{a}_i - (\vec{y} - \overrightarrow{x^c}) \cdot Z(\overrightarrow{x^c})^T \cdot Z (\overrightarrow{x^c}) \cdot Z(\overrightarrow{x^c})^T)^{-1}$ where $\overrightarrow{x^c}$ is $\vec{x}$ with coupling matrix model C applied For indirect learning: $\vec{a}_{i+1} = \vec{a}_i = \mu (\overrightarrow{x_{DPD}^c} - Z(\vec{y})\vec{a}_i)^H Z (\vec{y})$ where $\overrightarrow{x_{DPD}^c}$ is $\overrightarrow{x_{DPD}}$ with coupling matrix model C applied 7) The matrix D coefficients are maintained: $D_{i+1}=D_i$ Else:
6) The DPD coefficients are maintained: $\vec{a}_{i+1} = \vec{a}_i$
7) The D matrix coefficients are updated: $D_{i+1}=D_i+\beta C^H \vec{\varepsilon}_2 v^H - \alpha \varepsilon_{power} D_i v v^H$ J can be any whole number. For example, J=10 means that DPD coefficients are only updated on every $10^{th}$ iteration round whereas the matrix D is trained during every iteration except on every $10^{th}$ iteration. At the end of training, both matrix D and DPD models may have reached their ideal values. By iteratively switching between training the DPD and the D matrix, DPD may be trained to correct the PA distortions that it can easily correct and the D matrix may correct the distortion that the DPD was not able to correct.

Figure 5:
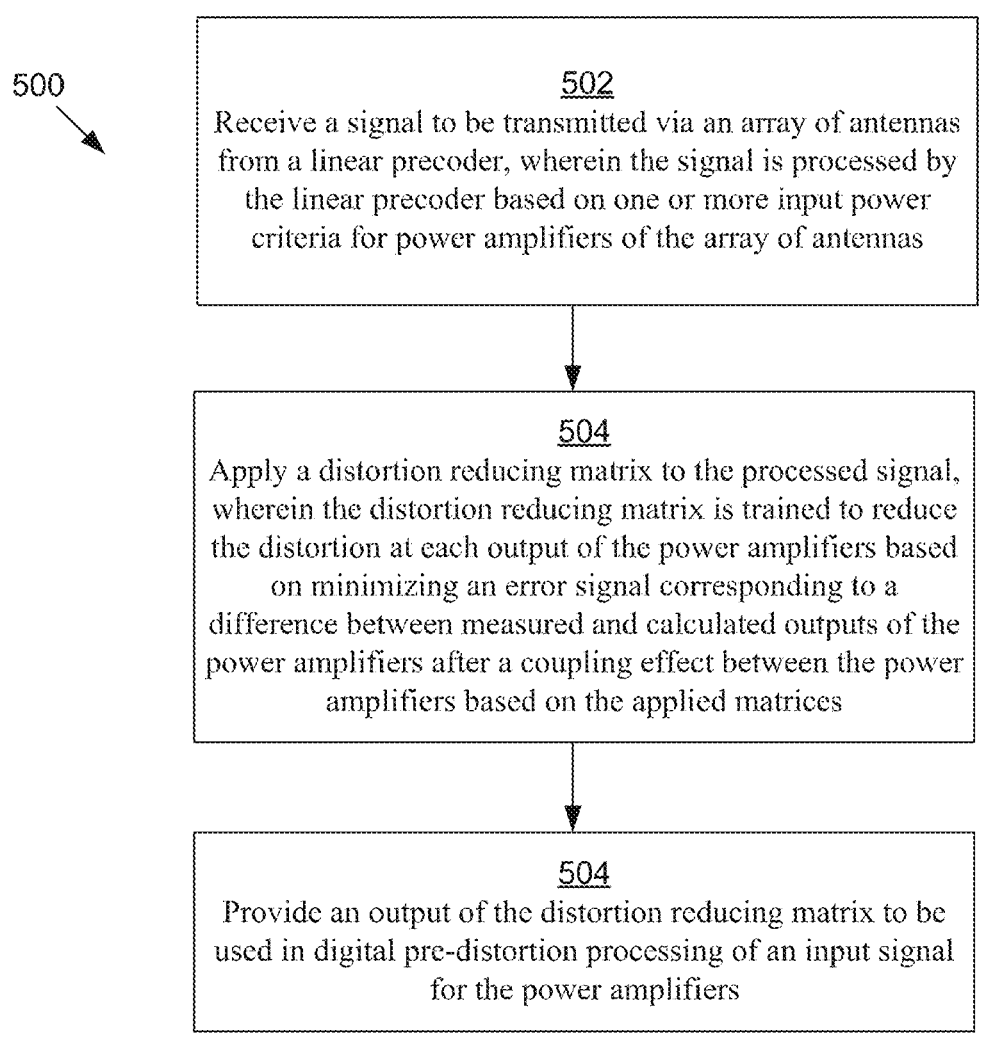
FIG. 5 illustrate an example of a method for distortion reducing precoding.

FIG. 5 illustrate an example of a method for distortion reducing precoding. The method may be performed by a transmitter device, such as the apparatus 100. In one example, the transmitter device may be a network device configured to operate in a MIMO system.

At 502, the method may comprise receiving a signal to be transmitted via an array of antennas from a linear precoder, wherein the signal is processed by the linear precoder based on one or more input power criteria for power amplifiers of the array of antennas. The linear precoder may be, for example, a zero-forcing precoder. The one or more criteria may comprise, for example, equal power or fixed power per PA. In one example, the input signal may be processed by the linear or zero forcing precoder by applying an equal power precoding matrix for equal power input to the distortion reducing matrix.

At 504, the method may comprise applying a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices.

At 506, the method may comprise providing an output of the distortion reducing matrix to be used in digital predistortion processing of an input signal for the power amplifiers.

Further features of the methods directly result for example from functionality of the transmitter device 216 or the apparatus 100, as described throughout the description, claims, and drawings, and are therefore not repeated here. An apparatus, for example a device for signal processing in a MIMO system, may be configured to perform or cause performance of any aspect of the method(s) described herein. Further, a computer program, a computer program product, or a (non-transitory) computer-readable medium may comprise instructions for causing, when executed by an apparatus, the apparatus to perform any aspect of the method(s) described herein. Further, an apparatus may comprise means for performing any aspect of the method(s) described herein. According to an example embodiment, the means comprises at least one processor; and at least one memory storing instructions that, when executed by the at least one processor, cause the apparatus at least to perform any aspect of the method(s).

Any range or device value given herein may be extended or altered without losing the effect sought. Also, any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps or operations of the methods described herein may be carried out in any suitable order, or simultaneously where appropriate. Additionally, individual blocks may be deleted from any of the methods without departing from the scope of the subject matter described herein. Aspects of any of the example embodiments described above may be combined with aspects of any of the other example embodiments described to form further example embodiments without losing the effect sought.

The term 'comprising' is used herein to mean including the method, blocks, or elements identified, but that such blocks or elements do not comprise an exclusive list and a method or apparatus may contain additional blocks or elements.

As used herein, "at least one of the following: <a list of two or more elements>" and "at least one of <a list of two or more elements>" and similar wording, where the list of two or more elements are joined by "and" or "or", mean at least any one of the elements, or at least any two or more of the elements, or at least all the elements.

Although subjects may be referred to as 'first' or 'second' subjects, this does not necessarily indicate any order or importance of the subjects. Instead, such attributes may be used solely for the purpose of making a difference between subjects.

As used in this application, the term 'circuitry' may refer to one or more or all of the following: (a) hardware-only circuit implementations (such as implementations in only analog and/or digital circuitry) and (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and or processor(s), such as a microprocessor(s) or a portion of a microprocessor(s), that requires software (e.g., firmware) for operation, but the software may not be present when it is not needed for operation. This definition of circuitry applies to all uses of this term in this application, including in any claims.

As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from scope of this specification.

The invention claimed is:

1. An apparatus, comprising:
    at least one processor;
    and at least one memory storing instructions that, when executed by the at least one processor, cause the apparatus at least to:
    receive a signal to be transmitted via an array of antennas from a linear precoder, wherein the signal is processed by the linear precoder based on one or more input power criteria for power amplifiers of the array of antennas;
    apply a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices,
    and wherein the distortion reducing matrix is further trained based on minimizing an error signal corresponding to a difference between a measured total input power to the power amplifiers and a total input power provided to the power amplifiers at startup of the apparatus; and
    provide an output of the distortion reducing matrix to be used in digital pre-distortion processing of an input signal for the power amplifiers.

2. The apparatus of claim 1, wherein the apparatus further comprises the linear precoder configured to receive the signal to be processed and output the processed signal to the distortion reducing matrix; and
    wherein the one or more criteria comprise at least one of equal or fixed input power for the power amplifiers.

3. The apparatus of claim 1, wherein the signal is processed by applying an equal power zero-forcing precoding matrix for equal power input to the distortion reducing matrix.

4. The apparatus of claim 1, wherein the apparatus is further caused to:
    process the output of the distortion reducing matrix based on digital pre-distortion models trained to compensate nonlinear distortion of the power amplifiers; and
    provide an output of the digital pre-distortion models as the input signal to the power amplifiers.

5. The apparatus of claim 1, wherein the apparatus further comprises at least one of the array of antennas, wherein the number of the antennas in the array is greater than a number of receivers served by the antennas, or the power amplifiers of the array of antennas.

6. The apparatus of claim 1, wherein the distortion reducing matrix is one of a frequency independent matrix, a frequency independent vector, a frequency dependent matrix per a subcarrier or a group of subcarriers or a frequency dependent vector per a subcarrier or a group of subcarriers.

7. The apparatus of claim 1, further caused to:
    train the distortion reducing matrix at a startup of the apparatus for all power amplifiers of the array of antennas using random signals and random channel matrices.

8. The apparatus of claim 1, wherein the apparatus is further caused to:
    update coefficients of the distortion reducing matrix based on minimizing a weighted sum of the error signal of the outputs of the power amplifiers and the error signal of the total input power to the power amplifiers with a least mean square algorithm.

9. The apparatus of claim 8, further caused to:
    detect a change in at least one of behaviour of the plurality of power amplifiers, the coupling effect between the plurality of power amplifiers or an ambient environment; and
    update the coefficients of the distortion reducing matrix in response to the detected change.

10. The apparatus of claim 8, wherein the distortion reducing matrix is iteratively trained and the apparatus is caused to:
    set the distortion reducing matrix initially to an identity matrix; and
    for every iteration round:
    generate a random channel matrix;
    calculate the linear precoder based on a channel response determined based on the random channel matrix, a matrix model of the coupling effect and the distortion reducing matrix;
    generate a random test signal;
    calculate an output of the distortion reducing matrix based on the calculated linear precoder and the test signal, and apply the output to the power amplifiers;
    obtain measured outputs of the power amplifiers after the coupling effect; and
    update coefficients of the distortion reducing matrix based on the measured and calculated values of the iteration round.

11. The apparatus of claim 8, wherein the distortion reducing matrix is iteratively trained and the apparatus is caused to:
    set the distortion reducing matrix initially to an identity matrix;
    determine that a signal-to-noise ratio at outputs of the power amplifiers is below a threshold; and
    perform iteration rounds while the signal-to-noise ratio is below the threshold, wherein for every iteration round the apparatus is caused to:
    generate a random channel matrix;
    calculate the linear precoder based on a channel response determined based on the random channel matrix, a matrix model of the coupling effect and the distortion reducing matrix;
    generate a random test signal;
    calculate an output of the distortion reducing matrix based on the calculated linear precoder and the test signal;
    calculate an output of the digital pre-distortion models based on the output of the distortion reducing matrix, and apply the output of the digital pre-distortion models to the power amplifiers;
    obtain measured outputs of the power amplifiers after the coupling effect;
    determine if a current iteration round count is divisible by a predetermined positive integer;
    if the current iteration round count is divisible by the predetermined positive integer, update model coefficients of one of the digital pre-distortion models or the distortion reducing matrix based on the measured and calculated values of the iteration round while maintaining coefficients of one of the distortion reducing matrix or the digital pre-distortion models; and
    if the current iteration round count is not divisible by the predetermined positive integer, update coefficients of one of the distortion reducing matrix or the digital pre-distortion models based on the measured and calculated values of the iteration round while model coefficients of one of the digital pre-distortion models or the distortion reducing matrix are maintained.

12. The apparatus of claim 11, wherein the coefficients of the digital pre-distortion models are updated per power amplifier with a direct learning algorithm based on the measured outputs of the power amplifiers and the output of the distortion reducing matrix with the matrix model for the coupling effect applied.

13. The apparatus of claim 11, wherein the coefficients of the digital pre-distortion models are updated per power amplifier with an indirect learning algorithm based on the measured outputs and the output of the digital pre-distortion models with the matrix model for the coupling effect applied.

14. The apparatus of claim 1, wherein the apparatus is a network device.

15. A method, comprising:
 receiving a signal to be transmitted via an array of antennas from a zero-forcing precoder, wherein the signal is processed by the linear precoder based on one or more input power criteria for power amplifiers of the array of antennas;

applying a distortion reducing matrix to the processed signal, wherein the distortion reducing matrix is trained to reduce the distortion at each output of the power amplifiers based on minimizing an error signal corresponding to a difference between measured and calculated outputs of the power amplifiers after a coupling effect between the power amplifiers based on the applied matrices, and wherein the distortion reducing matrix is further trained based on minimizing an error signal corresponding to a difference between a measured total input power to the power amplifiers and a total input power provided to the power amplifiers at startup of the apparatus; and providing an output of the distortion reducing matrix to be used in digital pre-distortion processing of an input signal for the power amplifiers.

* * * * *